United States Patent [19]

Hunsinger et al.

[11] 4,162,465

[45] Jul. 24, 1979

[54] SURFACE ACOUSTIC WAVE DEVICE WITH REFLECTION SUPPRESSION

[75] Inventors: Bill J. Hunsinger, Mahomet, Ill.; Kentaro Hanma, Yokohama, Japan

[73] Assignee: University of Illinois Foundation, Urbana, Ill.

[21] Appl. No.: 833,028

[22] Filed: Sep. 14, 1977

[51] Int. Cl.$^2$ .................... H03H 9/04; H03H 9/32; H03H 9/30; H01L 41/10

[52] U.S. Cl. .................... 333/151; 310/313; 333/194; 333/196

[58] Field of Search ............ 333/30 R, 71, 72; 310/313; 331/107 A; 330/5.5

[56] References Cited

U.S. PATENT DOCUMENTS

| | | | |
|---|---|---|---|
| 3,936,774 | 2/1976 | Mellon et al. | 333/30 R |
| 3,990,023 | 11/1976 | Kodama | 333/30 R |

*Primary Examiner*—Alfred E. Smith
*Assistant Examiner*—Marvin Nussbaum
*Attorney, Agent, or Firm*—Martin Novack

[57] ABSTRACT

Applicants discovered that by employing selected transducer geometries, such as unbalanced dual-finger geometries, certain reflections, called "Mechanical electrical loaded" (MEL) reflections, can be generated which tend to cancel reflected waves inherently generated by surface acoustic wave devices.

In particular, the disclosure is directed to a transducer for a surface acoustic wave device adapted for coupling to an electrical load and/or source. A pair of interdigitated comb electrodes are formed on an acoustic wave propagating substrate, for example a piezoelectric substrate. Means, such as input or output terminals, are provided for applying an electrical load and/or source across the pair of comb electrodes. Each of the comb electrodes has a plurality of interdigitated electrode fingers. The width of at least some of the adjacent fingers of the electrodes are different and are selected as a function of the impedance of the load and/or source to produce mechanical electrical loaded (MEL) reflections in said substrate which tend to cancel regeneration wave (RW) reflections generated at the transducer in the substrate. In the preferred embodiment of the invention, each of the comb electrodes has at least two adjacent electrode fingers of different widths, and preferably has a plurality of adjacent finger pairs of different widths.

12 Claims, 7 Drawing Figures

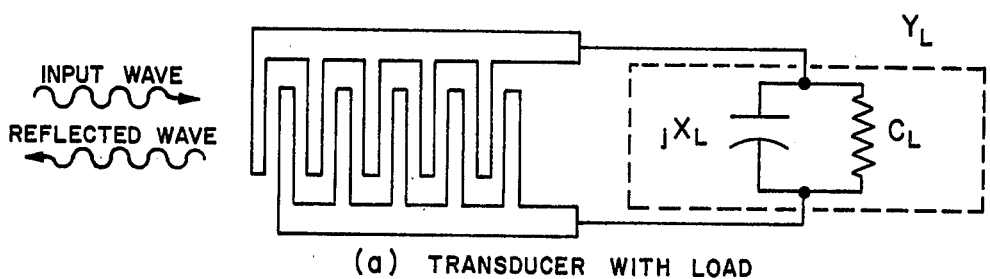
(a) TRANSDUCER WITH LOAD
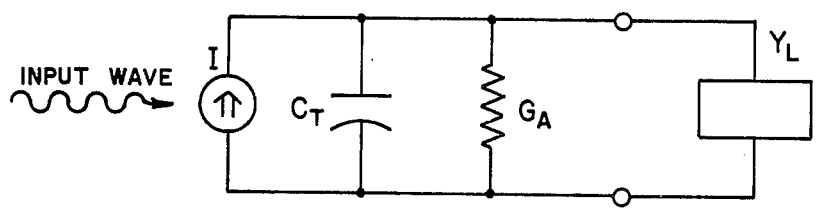
FIG. 3  (b) EQUIVALENT CIRCUIT
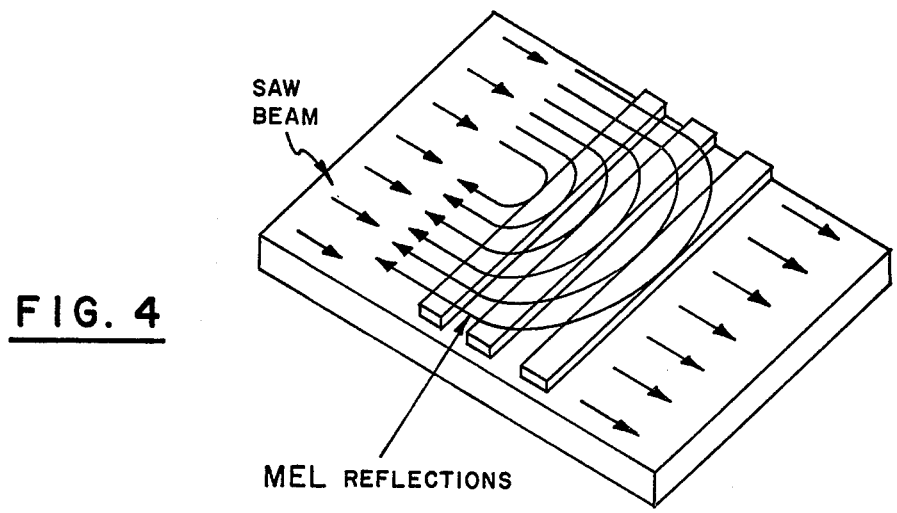
FIG. 4
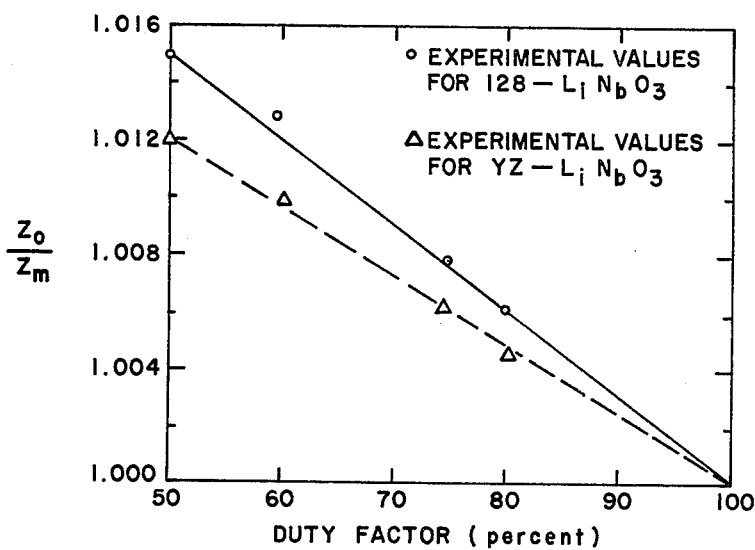
FIG. 5

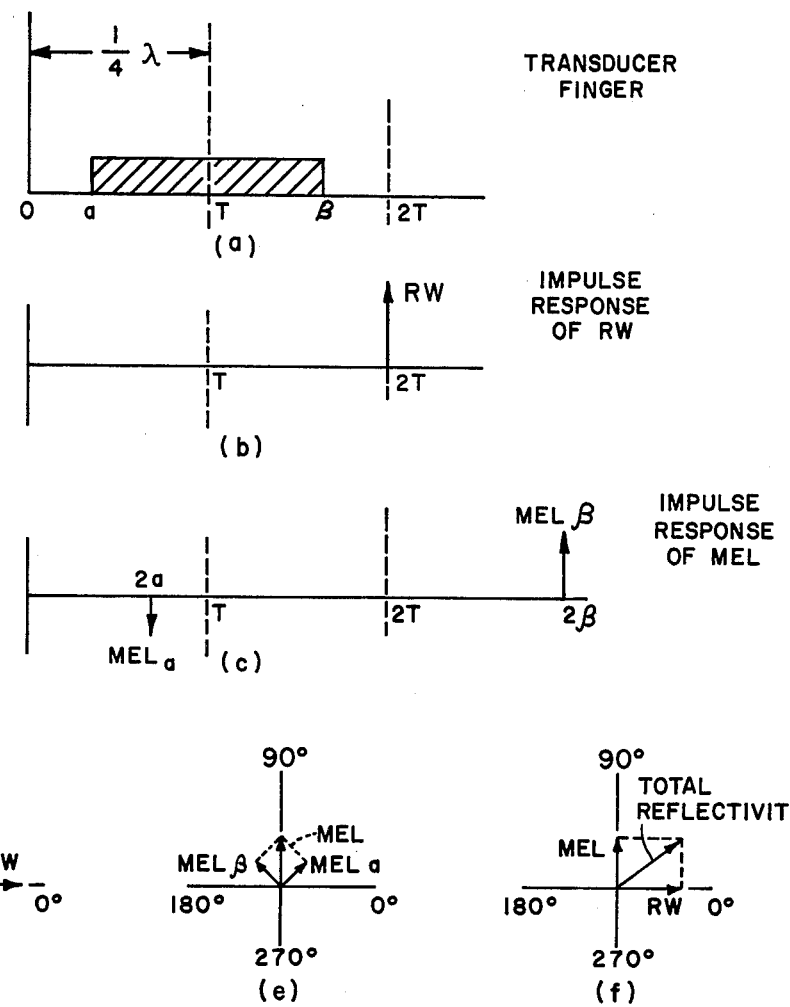
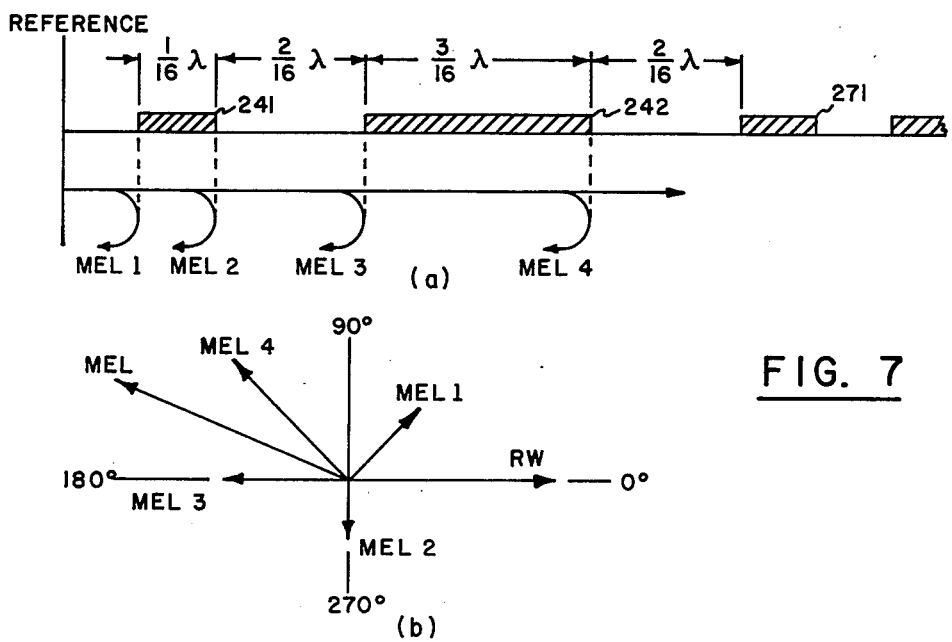
FIG. 6
FIG. 7

SURFACE ACOUSTIC WAVE DEVICE WITH REFLECTION SUPPRESSION

BACKGROUND OF THE INVENTION

This invention relates to surface acoustic wave devices and, more particularly, to improved transducers for surface acoustic wave devices.

In recent years, surface acoustic wave (SAW) devices have been employed in an increasing number of practical applications such as filters and delay lines. Surface acoustic wave devices are becoming particularly important in the construction of electronic signal processing equipment becuase they can be constructed on a plane surface using integrated circuit fabrication techniques and they can operate at UHF and VHF frequencies where other types of planar signal processing elements work with limited effectiveness. In a typical surface acoustic wave device, opposing "combs" of interdigitated metal fingers are disposed on a piezoelectric substrate and a surface acoustic wave can be established on the substrate by electrically exciting the fingers. Conversely, an electrical signal can be induced across the fingers by a surface acoustic wave propagating in the piezoelectric substrate material beneath the transducer. The geometrical configuration of the fingers is selected to yield desired device characteristics; for example, the spacing between fingers typically being chosen as a function of the primary wavelength to be propagated in the surface acoustic wave device.

An unfortunate limitation of conventional surface acoustic wave transducers is the fact that when they are made to operate with relatively low losses there is an inherent reflection emitted from the transducer. This "regeneration wave" (known as an "RW" wave) is an inherent consequence of extraction of acoustic surface wave energy and conversion of this energy to electrical signals, and it cannot be directly eliminated since it is inherent in operation of the transducer. The reflection causes spurious signals which are detrimental to most signal processing applications of the surface acoustic wave device. For example, if a wave is reflected from a receiver transducer it will travel back toward the transducer from which it was originally transmitted and then be again reflected from that transducer back toward the receiver transducer. This gives rise to the so-called "triple-transit" reflections (due to the total of three traversals by the twice reflected signal) which are highly undesirable.

It is one of the objects of the present invention to provide a novel transducer for a surface acoustic wave device, the transducer minimizing the undesirable reflections present in prior art devices without substantially sacrificing the efficiency of the device.

SUMMARY OF THE INVENTION

Applicants have discovered that by employing selected transducer geometries, such as unbalanced dual-finger geometries, another type of reflections, called "mechanical electrical loaded" (MEL) reflections can be generated which tend to cancel the inherent RW reflections. Mechanical electrical loaded (MEL) waves are not a function of electrical loading and arise simply because the transducer fingers are located in the propagation path of the acoustic wave. In the prior art, these MEL reflections are typically eliminated at the center frequency of operation by using conventional double finger transducers. Applicants, however, have discovered that the MEL waves can be put to advantage by employing transducer geometries wherein the MEL waves tend to cancel the RW waves.

In particular, applicant's invention is directed to a transducer for a surface acoustic wave device adapted for coupling to an electrical load and/or source. In accordance with the invention, a pair of interdigitated comb electrodes are formed on an acoustic wave propagating substrate, for example a piezoelectric substrate. Means, such as input or output terminals, are provided for applying an electrical load and/or source across the pair of comb electrodes. Each of the comb electrodes has a plurality of interdigitated electrode fingers. The width of at least some of the adjacent fingers of the electrodes are different and are selected as a function of the impedance of the load and/or source to produce mechanical electrical loaded (MEL) reflections in said substrate which tend to cancel regeneration wave (RW) reflections generated at the transducer in the substrate.

In the preferred embodiment of the invention, each of the comb electrodes has at least two adjacent electrode fingers of different widths, and preferably has a plurality of adjacent finger pairs of different widths. As stated, the widths are selected as a function of the impedance of the load and/or source, but in one embodiment of the invention the adjacent fingers are proportioned such that one of said adjacent fingers has a width that is at least twice as great as the width of the other of the adjacent fingers. In particular, applicants set forth an example wherein the electrical load is about 75 ohms and substantial cancellation of the RW wave is achieved by utilizing adjacent fingers having widths of $3/16\lambda$ and $1/16\lambda$, respectively, where $\lambda$ is the acoustic wavelength at the center frequency of operation of the surface acoustic wave device.

Further features and advantages of the invention will become more readily apparent from the following detailed description when taken in conjunction with the accompanying drawings.

BRIEF DESCRIPTION OF THE DRAWINGS

FIG. 3(a) and FIG. 3(b) respectively show a simplified model of a conventional alternating single finger transducer and load, and an equivalent circuit thereof.

FIG. 4 illustrates the nature of MEL reflections caused by metal lines on a surface acoustic wave device.

FIG. 5 is a graph of impedance discontinuity factor versus duty factor for a configuration of metal transducer elements on a piezoelectric substrate.

FIG. 6 and the graphs (a) through (f) thereof, illustrate the phase difference between RW and MEL reflections from a conductor line on a surface acoustic wave device.

FIG. 7(a) and FIG. 7(b) respectively illustrate a cross section through a portion of the transducer of FIG. 2, and a phasor diagram showing the phase difference between RW and MEL reflections therefrom.

DESCRIPTION OF THE PREFERRED EMBODIMENT

Figure 1:
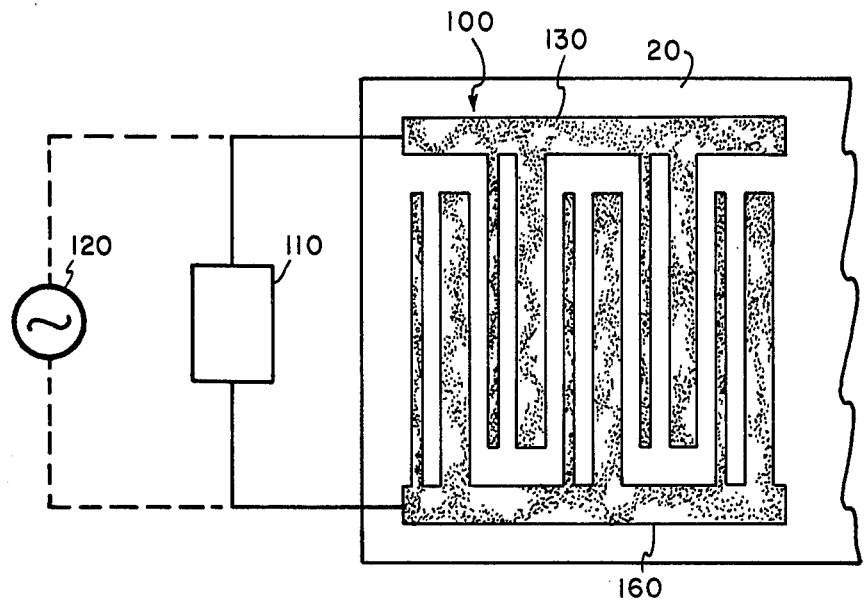
FIG. 1 is a plan view of a portion of a surface acoustic wave device employing an embodiment of a transducer in accordance with the invention.

Referring to FIG. 1, there is shown a portion of a surface acoustic wave device 10 which includes a piezoelectric substrate 20, typically formed of lithium niobate, and having an interdigitated transducer 100 formed thereon. Another interdigitated transducer (not shown) is typically formed on the substrate in spaced relation to the transducer 100. The transducer 100 comprises opposing comb electrodes 130 and 160, each of which has a plurality of electrode fingers extending therefrom and being interdigitated with each other. The electrodes 130 and 160 may be formed of any suitable conductive metal, for example aluminum. An electrical load 110 is illustrated as being coupled across the electrode 130, 160. However, it will be understood that a source 120 (shown in dashed line) may also be coupled across the electrodes 130, 160, depending upon whether the transducer 100 is utilized to excite surface acoustic waves in the substrate 20, to convert received surface acoustic waves to electrical signals, or both.

Figure 2:
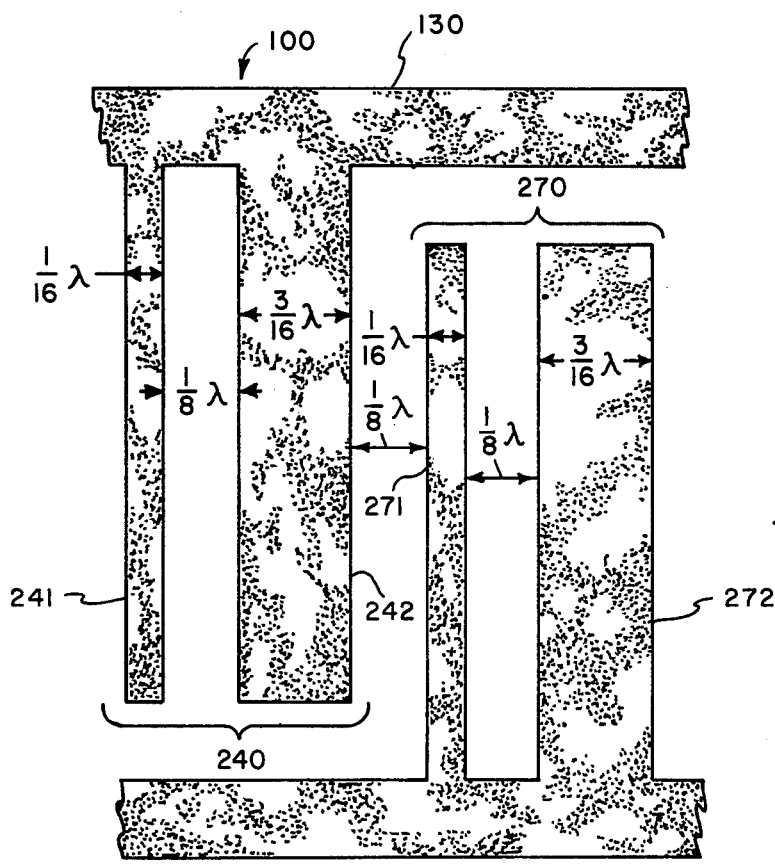
FIG. 2 is an enlarged plan cutaway view of the transducer of FIG. 1.

FIG. 2 is an enlarged view of a portion of the transducer 100 showing a dual-finger configuration of the electrodes 130 and 160 in accordance with the present embodiment. Typically, the dual-finger structure of the prior art would include successive pairs of equally spaced electrodes of equal width from the opposing combs, with this configuration resulting in the generation of little or no mechanical electrical loaded (MEL) waves due to the balanced nature of the electrode structure. In accordance with the principles of the present invention, an unbalanced finger structure is intentionally utilized since it is desired to generate MEL waves. Also, the structure is selected, as a function of the load and/or source coupled to the electrodes (which, inter alia, is determinative of the nature of the RW waves), so that the generated MEL waves tend to cancel the RW waves and thereby minimize overall undesired reflection. In the embodiment of FIG. 1, the spacing between fingers is about $\frac{1}{4}\lambda$ (where $\lambda$ is the acoustic center frequency). Each finger pair, in this embodiment, includes one finger which has a width of $1/16\lambda$, and an adjacent finger which has a width of $3/16\lambda$. When used in conjunction with an electrical load of about 75 ohms, the transducer of FIGS. 1 and 2 substantially eliminate the RW type of reflections generally encountered, the structure introducing MEL reflections which are out of phase with the RW reflections and tend to cancel the latter. As described below, different transducer geometries, e.g. different finger width selection, can be employed to generate the type of MEL reflection (i.e. of appropriate amplitude and phase) to substantially cancel the RW wave for that structure and the particular electrical load or source applied thereto.

The theory of operation will now be set forth using simplified models. Consider the conventional type transducer shown in FIG. 3, and assume there are no losses other than the 3 db bidirectional loss. The electrical circuit shown provides a basis for calculating the insertion loss (IL) and RW reflectivity. The load admittance $Y_L (Y_L = G_L + jX_L)$ is driven by an equivalent current generator and $G_a$ and $C_T$ are the input conductance and capacitance of the transducer respectively. The insertion loss derived from the model has been shown to be $$IL = \frac{(G_a + G_L)^2 + (\omega C_T + X_L)^2}{2 G_a G_L} \quad (1)$$

The regenerated wave reflectivity RW is the ratio of the power absorbed by the conductance $G_a$ to the incident power provided by the current source I:

$$RW = \frac{G_a^2}{(G_a + G_L + j\omega C_T + jX_L)^2} \quad (2)$$

The amplitude of RW ($|RW|$), and the phase of RW ($\angle RW$) are:

$$|RW| = \frac{G_a^2}{(G_a + G_L)^2 + (\omega C_T + X_L)^2} \quad (3)$$

$$\angle RW = \tan^{-1} \frac{\omega C_T + X_L}{G_a + G_L} \quad (4)$$

MEL reflectivity will now be considered. When an acoustic beam on a low coupling coefficient material ($k^2 << 1/N$) impinges upon a transducer as shown in FIG. 4, the MEL reflectivity $M(\omega)$ can be shown to be a composite of of the reflections from all the finger edges:

$$M(\omega) = \sum_{i=1}^{N} |R_i| e^{-j(\omega/v \cdot 2l_i + \phi_i)} \quad (5)$$

$$|R_i| = (1 - \sum_{k=1}^{N} |R_k|) \cdot |\gamma_i| \quad (6)$$

where $l_i$ is the distance to the i-th edge from the reference, $\phi_i$ is the angle of the reflection coefficient at the i-th edge, v is the surface wave velocity, N is the total number of edges and $|\gamma_i|$ is the magnitude of reflections at the i-th edge. The magnitude of MEL reflections depends on the acoustic impedance discontinuity caused by the transducer element. This acoustic impedance discontinuity is determined by the material parameters and the size of the transducer elements related to the acoustic wave length.

The reflectivity of various shorted 15 wavelength long unapodized transducers at center frequency were measured and substituted into the Mason model in order to determine acoustic impedance discontinuity factor. The acoustic impedance discontinuity factor ($Z_O/Z_m$) for 2000 Å thick aluminum transducer elements on YZ and 128° LiNbO$_3$ versus duty factor are shown in FIG. 5.

The phase difference between RW and MEL reflections will now be considered. When a transducer is tuned, the impulse response of RW reflections from a conductor line (FIG. 6a) is a positive impulse with time delay 2T as shown in FIG. 6b, since electrical signal is picked up and regenerated at the center of the conductor line. The impulse response of the MEL reflections are two impulses $M_\alpha$ and $M_\beta$ occurring at the $\alpha$ and $\beta$ edges. The polarity of $M_\alpha$ and $M_\beta$ are opposite because of reflection coefficient difference as shown in FIG. 6c. The RW reflection (RW) is expressed as the center frequency phasor as shown in FIG. 6d. The MEL reflections (MEL) are expressed as the center frequency phasor addition of $M_\alpha$ and $M_\beta$ which is located 90° out of phase from RW as shown in FIGS. 6e, 6f. If the transducer is not tuned, the phase of RW is shifted by an angle of equation (4) while the MEL remains unchanged. Therefore the phase difference between RW and MEL (PD) then is:

$$PD_{(degrees)} = 90 + \frac{180}{\pi} \tan^{-1} \frac{\omega C_T + X_L}{G_a + G_L} \quad (7)$$

which is more than 90 degrees.

The weak coupling approximations described above neglect second order interactions which can be accounted for in the Mason model. Mason model calculations show that the second order interactions increase the phase difference between the RW and MEL. For example the increase on a 15 wavelength long unapodized solid finger transducer on 128-LiN$_b$O$_3$ operating into a 500 Ω load is about 10°.

The foregoing description of balanced alternating individual finger transducers illustrates that effective cancellation does not occur with these structures. Also, balanced double-finger transducers do not have MEL reflections at center frequency, so RW reflections are present (and unabated) and monotonically increase with load impedance.

Returning now to the invented structure of FIGS. 1 and 2, FIG. 7 shows a cross section through fingers 241, 242 and 271 of the unbalanced double-finger transducer of FIG. 2. As previously described, the width of the first finger is 1/16 wavelength and the second is 3/16 wavelength. The MEL reflections from the metal edges as center frequency phasors is shown in FIG. 7b. Because the impedance discontinuity factor decreases with finger widths, the magnitudes of MEL 1,2 located at 45° and 270° respectively are smaller than those of MEL 3, 4 located at 135° and 180° respectively (see FIG. 5). The total MEL reflections in the composite of the four components has a phase of approximately 162°. Since most of the electric field in the substrate is concentrated at edges 1 and 4, the RW reflection is relatively unaffected by the change in finger widths and has the same phase as in a standard double-finger transducer.

Since the phase difference between RW and MEL reflections approaches 180° substantial cancellation of MEL and RW reflections is attained at the center frequency. It should be noted that only center frequency has been considered in this analysis and the actual triple transit suppression will depend upon the bandwidth of the transducer in question.

The invention has been described with reference to a particular embodiment, but variations within the spirit and scope of the invention will occur to those skilled in the art. For example, while a double-finger embodiment has been illustrated and is preferred, it will be understood that unbalanced single, triple, etc. configurations could be utilized, so long as the MEL reflections therefrom tend to cancel RW reflections for the particular load conditions utilized.

We claim:

1. A transducer for a surface acoustic wave device which includes an acoustic wave propagating substrate, said transducer being adapted to coupling to an electrical load and/or source, comprising:
   a pair of interdigitated comb electrodes formed on said substrate;
   means for applying an electrical load and/or source across said pair of comb electrodes;
   each of said comb electrodes having a plurality of interdigitated electrode fingers, the widths of at least some of the adjacent fingers thereof being different and selected as a function of the impedance of said load and/or source to produce mechanical electrical loaded (MEL) reflections in said substrate which tend to cancel regeneration wave (RW) reflections generated at said transducer in said substrate.

2. The transducer as defined by claim 1 wherein each of said comb electrodes has at least two adjacent electrode fingers of different widths.

3. The transducer as defined by claim 2 wherein one of said adjacent fingers has a width which is at least twice as great as the width of the other of the adjacent fingers.

4. The transducer as defined by claim 2 wherein said adjacent fingers have a ratio of widths of about three to one.

5. The transducer as defined by claim 4 wherein said adjacent fingers have widths of 3/16λ and 1/16λ, respectively, where λ is the acoustic wavelength at the center frequency of operation of said device.

6. The transducer as defined by claim 1 wherein each of said comb electrodes has a plurality of adjacent finger pairs of different widths.

7. A surface acoustic wave device adapted for coupling to an electrical load and/or source, comprising:
   an acoustic wave propagating substrate;
   a transducer which includes a pair of interdigitated comb electrodes formed on said substrate;
   means for applying an electrical load and/or source across said pair of comb electrodes;
   each of said comb electrodes having a plurality of interdigitated electrode fingers, the widths of at least some of the adjacent fingers thereof being different and selected as a function of the impedance of said load and/or source to produce mechanical electrical loaded (MEL) reflections in said substrate which tend to cancel regeneration wave (RW) reflections generated at said transducer in said substrate.

8. The device as defined by claim 7 wherein each of said comb electrodes has at least two adjacent electrode fingers of different widths.

9. The device as defined by claim 8 wherein one of said adjacent fingers has a width which is at least twice as great as the width of the other of the adjacent fingers.

10. The device as defined by claim 8 wherein said adjacent fingers have a ratio of widths of about three to one.

11. The device as defined by claim 10 wherein said adjacent fingers have widths of 3/16λ and 1/16λ, respectively, where λ is the acoustic wavelength at the center frequency of operation of said device.

12. The device as defined by claim 7 wherein each of said comb electrodes has a plurality of adjacent finger pairs of different widths.

* * * * *